United States Patent [19]

Fürter et al.

[11] Patent Number: 5,402,267
[45] Date of Patent: Mar. 28, 1995

[54] CATADIOPTRIC REDUCTION OBJECTIVE

[75] Inventors: Gerd Fürter, Ellwangen; Wilhelm Ulrich, Aalen, both of Germany

[73] Assignee: Carl-Zeiss-Stiftung, Heidenheim, Germany

[21] Appl. No.: 154,093

[22] Filed: Nov. 18, 1993

Related U.S. Application Data

[63] Continuation-in-part of Ser. No. 826,121, Jan. 27, 1992, abandoned.

[30] Foreign Application Priority Data

Feb. 8, 1991 [DE] Germany ............... 41 03 790.1

[51] Int. Cl.⁶ ............................................. G02B 17/00
[52] U.S. Cl. ..................................... 359/727; 359/732
[58] Field of Search ........................... 359/726–728, 359/732–734, 735–736, 738–740

[56] References Cited

U.S. PATENT DOCUMENTS

| | | | |
|---|---|---|---|
| 3,698,808 | 10/1972 | Delmas | 355/45 |
| 4,953,960 | 9/1990 | Williamson | 359/726 |
| 5,089,913 | 2/1992 | Singh et al. | 359/726 |

FOREIGN PATENT DOCUMENTS 6944528 2/1970 Germany.
4110296 2/1991 Germany.

*Primary Examiner*—Loha Ben
*Assistant Examiner*—James Phan
*Attorney, Agent, or Firm*—Walter Ottesen

[57] ABSTRACT

The invention is directed to a catadioptric reduction objective having a concave mirror, a beam splitter and several lens groups but without an additional lens group disposed between the concave mirror and the beam splitter. Catadioptric reduction objectives are disclosed having an image-side aperture of 0.52 and 0.58 for an imaging scale of 1:4 and are corrected for an unrestricted excimer laser for use in submicronlithography.

9 Claims, 5 Drawing Sheets

CATADIOPTRIC REDUCTION OBJECTIVE

RELATED APPLICATION

This is a continuation-in-part of application Ser. No. 07/826,121, filed on Jan. 27, 1992, and entitled "Catadioptric Reduction Objective", now abandoned.

FIELD OF THE INVENTION

The invention relates to a catadioptric reduction objective having a concave mirror, a beam splitter and several lens groups.

BACKGROUND OF THE INVENTION

U.S. Pat. No. 4,953,960 discloses a catadioptric reduction objective of the kind referred to above. This objective includes four lens groups with the third lens group being arranged between the beam splitter and the concave mirror. This arrangement is intended to correct low order coma and spherical aberration of the mirror as well as the Gauss errors. The arrangement of the lens groups between the beam splitter and the mirror and the two-time passage of light resulting therefrom require however a high tolerance sensitivity to decentering with an influence on the coma correction. The refractive power of this third lens group is almost zero in order not to endanger a broad-band spectral correction.

For a significant increase of the image-side aperture, the space requirements of this third lens group require that the fourth lens group be spaced a very great distance from the mirror which, in an extreme case, can be greater than the focal length of this fourth lens group. In addition to a considerably greater manufacturing complexity, this also leads to a large increase in the difficulties encountered with respect to optical correction.

U.S. Pat. No. 5,089,913, in FIGS. 6, 10, 11, 12 and tables 2 to 5, discloses similar objectives having one spherical lens surface between the beam splitter and the concave mirror, either realized as a planoconvex lens fitted directly to the beam-splitting cube (FIGS. 6 and 10), or as a Mangin mirror (FIGS. 11 and 12).

All examples have a numerical aperture of 0.6. The reduction ratio is 5 (FIG. 6) and 4 for the others. The retrofocus ratio of the image-side lens group is 0.98 (FIG. 6), 1.01 (FIG. 10), 0.934 (FIG. 11) and 0.95 (FIG. 12). The free working distances (distance between last lens surface and target) are 0.5, 0.5991, 0.1933 and 0.1903 mm, respectively.

The schematic of FIG. 1 and the example of FIG. 2 and table 1 show objectives without a lens between the beam splitter and the mirror.

However, the geometry of FIG. 2 is obviously incompatible with the data of table 1 and the data of table 1 have been tried with a lens calculation algorithm and have proven not to be utilizable as starting values for such an objective. Hence, it is not possible for the specialist in microlithographic lens design to learn more from this than the contents of the schematic of FIG. 1, namely that a microlithographic catadioptric reduction objective might in principle be possible without a lens between the beam splitter and the mirror. However, nothing is to be found about the conditions for this possibility.

U.S. Pat. No. 3,698,808 (see claim 6, FIG. 4) shows a microlithographic projection apparatus with a first lens group, a semireflecting plane mirror arranged under 45 degrees, a concave mirror and a second lens group arranged under 90 degrees with respect to the axis of the first lens group and the concave mirror.

The separation of the projection objective and the introduction of the semireflecting plane mirror serves the introduction of a second, visible, light source for position control. The reduction ratio is minus one, both lens groups having the same high aperture and the mirror giving no reduction. It is difficult to transform such a construction to the demands of an objective with relevant reduction, as known, for example, from the introduction of U.S. Pat. No. 4,953,960.

SUMMARY OF THE INVENTION

It is an object of the invention to improve the reduction objective of the kind described above so that a great image-side aperture is obtained while at the same time providing a reduced sensitivity to adjustment and an advantageous configuration with a long working distance. It is also an object of the invention to provide such a reduction objective which is suitable for use in the area of projection microlithography.

The catadioptric reduction objective of the invention includes a concave mirror, a beam splitter having an exit/reentry surface and several lens groups. It is a feature of the invention that no lens group is arranged between the concave mirror and the beam splitter and that the concave mirror provides a substantial reduction ratio. Accordingly, the exit/reentry surface and the concave mirror conjointly define a clear uninterrupted space therebetween.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
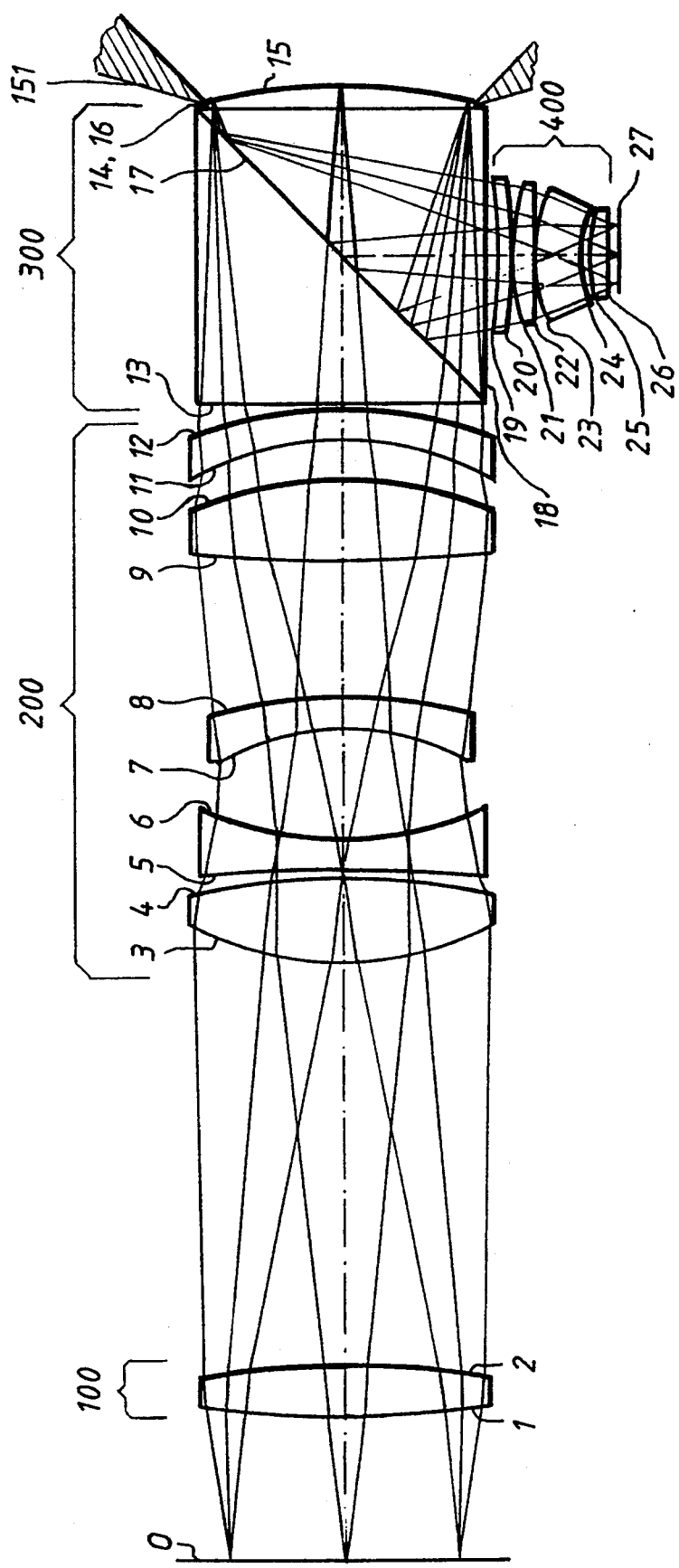
FIG. 1 is a schematic of a first embodiment of the catadioptric reduction objective according to the invention.

In FIG. 1 and Table 1, the following are shown for the first embodiment: the object plane 0, the optical boundary surfaces 1 to 26 according to Table 1 and the image plane 27. A lithographic specimen (reticle) is disposed in the object plane 0 and a wafer to be illuminated lies in the image plane 27. A first lens group comprises two lens sub-groups. The first lens sub-group 100 comprises only a single lens having the boundary surfaces 1 and 2. The boundary surfaces 3 to 12 define a second lens sub-group 200. The spacing of the second lens sub-group 200 to the first lens sub-group 100 is greater than the diameter of the light beam so that a folding mirror can be mounted diagonally in the intermediate space as required and shown in U.S. Pat. No. 4,953,960 and also in FIG. 3.

The beam splitter 300 has the following: the entry surface 13, the exit surface 14 identical to the return entry surface 16, the splitting mirror surface 17 arranged diagonally and the exit surface 18.

The beam splitter 300 has a precise cubical shape which is simpler to manufacture than the truncated pyramid of the system disclosed in U.S. Pat. No. 4,953,960. The concave mirror 15 is mounted close to the beam splitter 300 without intermediate components. The concave mirror 15 defines an aperture diaphragm 151 by its boundary. This aperture diaphragm, however, can also be realized on the exit/reentry surface 14/16 of the beam splitter 300 or on a special part in the space therebetween.

A second lens group 400 having the boundary surfaces 19 to 26 completes the assembly and the image of the object plane 0 is the image plane 27.

All glass components are made of the same quartz glass with n=1.50855 at 248 nm.

In this way, the objective has the largest object height of 60 mm with a telecentric beam path. With the reduction of 4:1, the image height is 15 mm at the image side, the numerical aperture is 0.52 and the beam path is likewise telecentric. The mirror has a clear diameter of 139 mm and the largest diameter of the beam in the objective is 159 mm at the boundary surface 3. The overall focal length of the lens sub-groups 100 and 200 is 475 mm and the concave mirror 15 has a focal length of 158 mm and the downstream second lens group 400 has a focal length of 129 mm.

The reduction ratio of the concave mirror 15 is 0.14. It supplies an essential part of the overall reduction ratio of the objective according to the invention. Table 4 provides a list of preferred reduction ratios of mirror 15 in dependence upon the overall reduction ratio of the objective.

The aperture diaphragm is disposed at the location of the concave mirror to avoid vignetting. The second lens group 400 is arranged downstream of the concave mirror 15. The focal point of the second lens group 400 must lie in the diaphragm, that is in the concave mirror 15, to satisfy the image-side telecentric condition. At the same time, the beam splitter 300 and, in the case of the embodiment shown in U.S. Pat. No. 4,953,960, the additional lens group must have space between the second lens group 400 and the concave mirror 17.

The objective disclosed in FIG. 1 of U.S. Pat. No. 4,953,960 requires (for an image-side numerical aperture of 0.45 and a clear mirror diameter of 112 mm as well as a focal length of 131 mm of the downstream lens group) a minimum total distance in air to the mirror of 108 mm, where said total distance in air is defined as the sum of the individual distances, each distance divided by the refractive index of the local medium $$\left(d_{total} = \sum_i d_i/n_i\right).$$

The spacing is caused by the arrangement of the beam splitter and the additional lens group. Therefore, there is sufficient space for satisfying the position requirements for which the focal length should be greater than the back focus.

With the numerical aperture of 0.52 and the further data of the example shown, the spacing however becomes 115 mm so that the solution according to the invention is easily realizable; however, the insertion of a lens group having an air path of approximately 25 mm causes the focal length of 129 mm to be exceeded significantly. The retrofocus ratio which then occurs (pupillary distance/focal length) is greater than one and would be very disadvantageous and would require considerable corrective measures and additional complexity in the second lens group 400, for example, intense negative refractive forces near the image plane.

The focal length of the second lens group 400 is essentially determined only by the ratio of the mirror diameter to the image-side aperture. An extension of this focal length would therefore require a larger concave mirror 15 and therefore also a larger beam splitter 300. However, this is not desired for constructive, economic and manufacturing reasons. Furthermore, the required back focus distance of this lens group then increases because of the additional space requirement so that the defined retrofocus ratio becomes only insignificantly more advantageous.

For greater apertures starting approximately at 0.50, a space problem develops for a configuration as disclosed in U.S. Pat. No. 4,953,960 for accommodating the optical component groups which the solution provided by the invention avoids.

Advantageous for the application are the following: the configuration of the second lens group 400 with a reduced curvature of the last lens surface 26 and a back focus distance of 5 mm to the image plane and a corresponding working distance which permits a simple manipulation of the wafer to be illuminated.

A working distance of less than 0.6 mm as found in the examples of U.S. Pat. No. 5,089,913, in contrast, causes severe problems of damage by contact with wafers, of wafer handling with very tight tolerances even during transport, and of deposition of material on the first lens surface during exposition of the photoresist on the wafer.

The substantial working distance, however, makes design with a high numerical aperture more difficult.

The precise objective data are given in Table 1. Table 3 shows comparative data for the following: this embodiment of FIG. 1, the embodiment of FIG. 2 and the configuration of FIG. 1 of U.S. Pat. No. 4,953,960.

Figure 2:
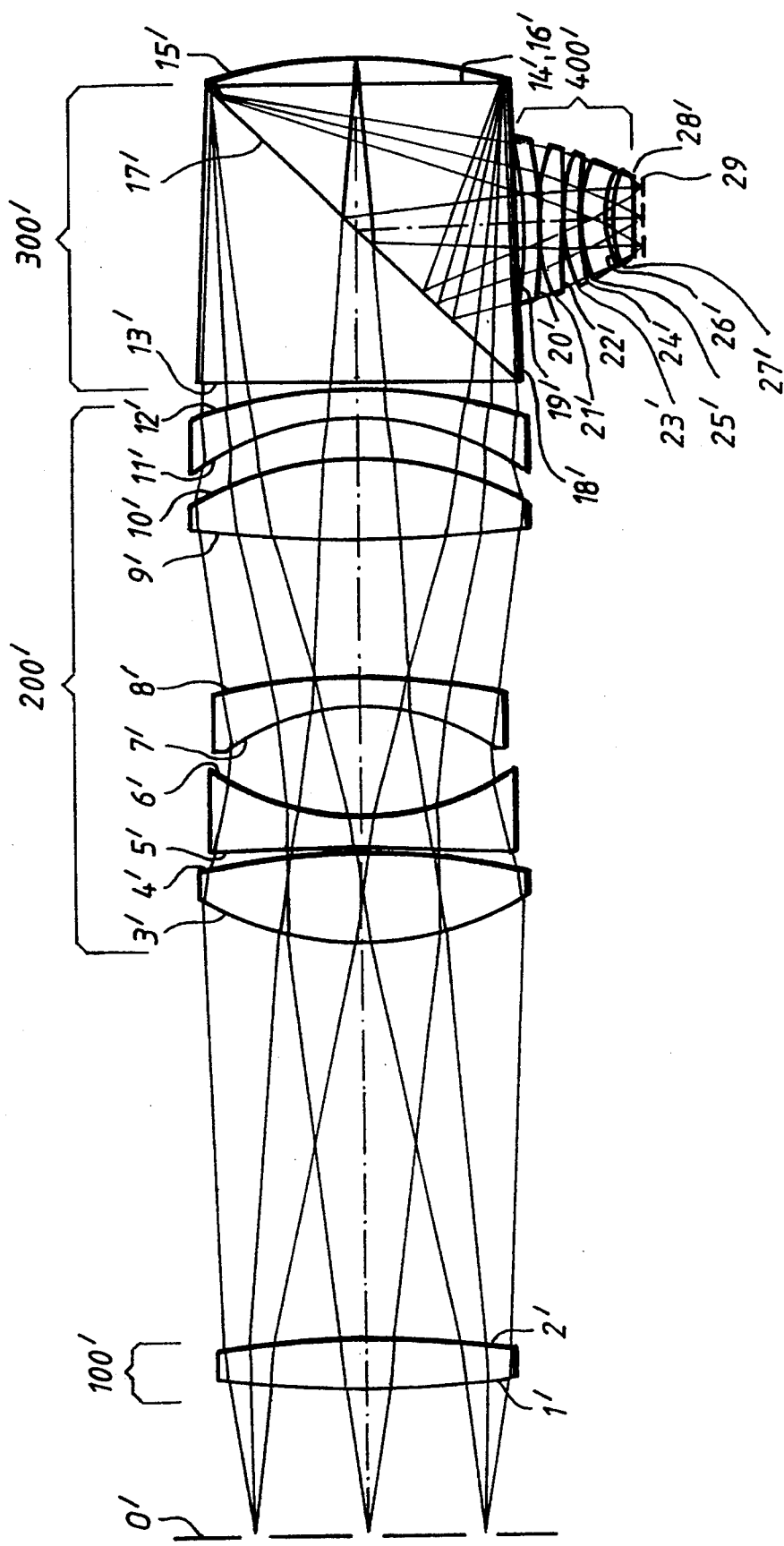
FIG. 2 is a schematic showing a second embodiment of the catadioptric reduction objective according to the invention.

A second embodiment for the same determining dimensions of the objective (image field, imaging scale, image-side working distance, telecentric on both sides, wavelength of the fundamental mode 248 mm, one glass type) for further increased image-side aperture of 0.58 is shown in FIG. 2. The data are assembled in Table 2.

This embodiment has one lens more in the second lens group 400 than does the embodiment shown in FIG. 1.

The beam splitter 300 is configured as a truncated pyramid as shown in FIG. 1 of U.S. Pat. No. 4,953,960.

The end faces of the truncated pyramid and the outer face 18' are adapted to the beam running from the second lens sub-group 200' to the concave mirror 15'.

In this way, a volume of glass becomes unnecessary and the spacing problem of the concave mirror 15' and the second lens group 400 associated with the embodiment of FIG. 1 is somewhat mitigated.

The diagonal position of the exit face 18' which is formed in this way with respect to the optical axis is compensated by the deviation of the mirror face 17' from a 45° angle.

Also in this embodiment, for the large image-side aperture of 0.58, a retrofocus-objective embodiment of the second lens group 400' is avoided. The greater aperture is achieved with the addition of only one lens aside from the larger cross sections of the optical elements.

Table 3 shows a comparison of important characteristic data of the embodiments of FIGS. 1 and 2 in addition to the embodiment of FIG. 1 of U.S. Pat. No. 4,953,960.

In both embodiments, the chromatic correction for the use with a spectrally unrestricted excimer laser is configured for the wavelength 248 nm. These embodiments can easily be converted for other wavelengths of the same laser or for other lasers. Furthermore, also several different materials such as quartz or fluoride can be used for increasing the chromatic correction.

The telecentrics which are particular to the object side are insignificant with respect to the invention. A further performance increase is likewise possible with aspheric bodies which, however, are difficult to produce. The beam splitter is also possible in another embodiment such as in the form of beam-splitter platelets.

Figure 3:
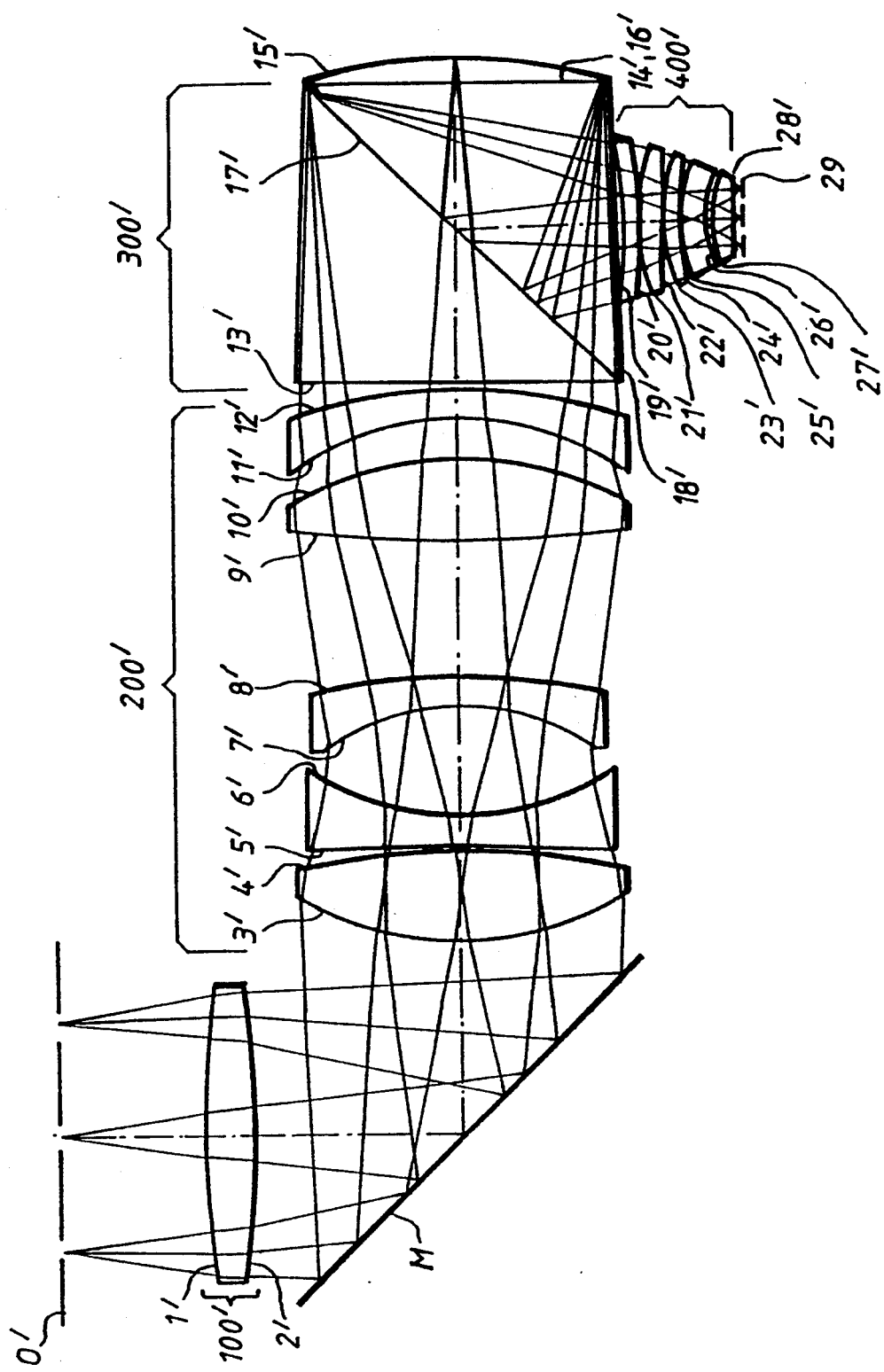
FIG. 3 is a schematic showing a third embodiment of the catadioptric reduction objective according to the invention.

FIG. 3 shows a variation of the embodiment of FIG. 2, where a folding mirror M is introduced between the first lens sub-group 100' and the second lens sub-group 200'. This allows for parallel positions of object plane 0' and image plane 29.

Figure 4:
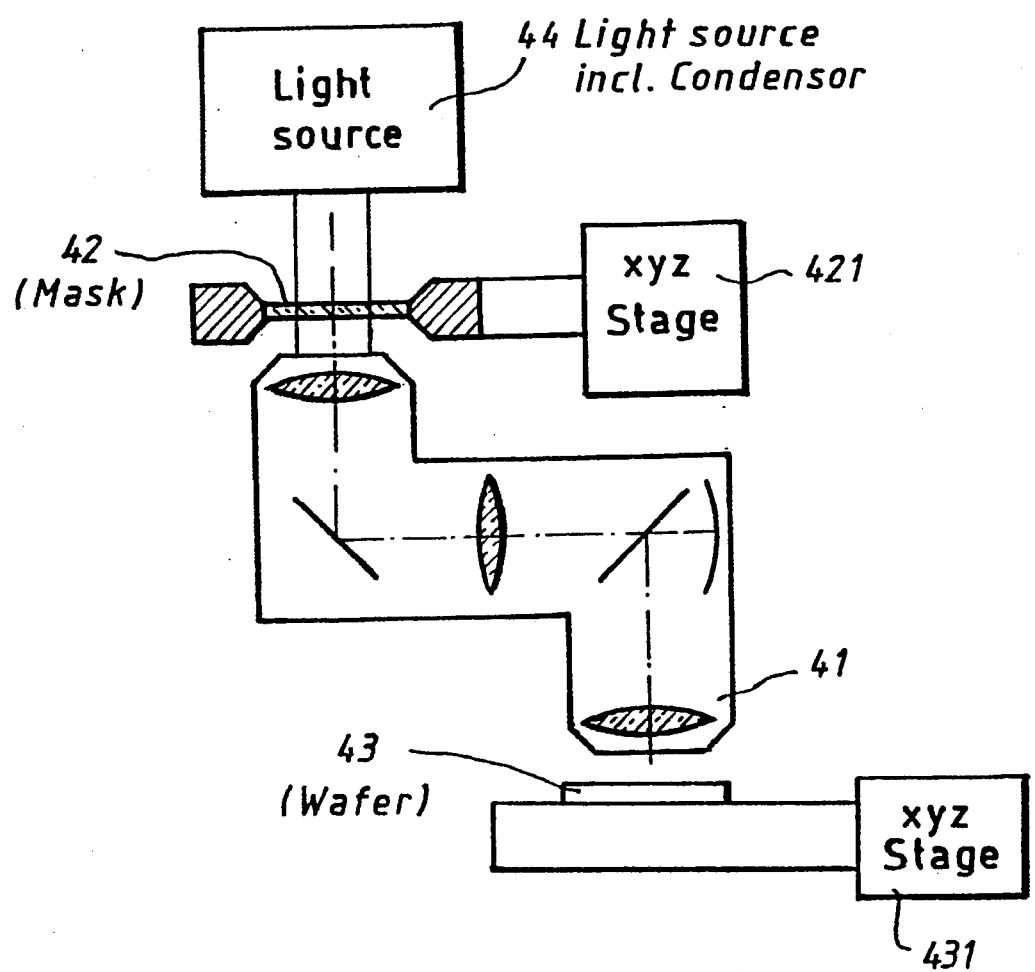
FIG. 4 is a schematic showing a microlithographic projection apparatus, known as a wafer stepper, including the catadioptric reduction objective of FIG. 3; and, FIG. 5 is a detail view of the beam splitter and concave mirror shown in FIG. 1 and shows an aperture diaphragm at the location of the concave mirror and at a predetermined spacing from the second lens group.

FIG. 4 shows the integration of this catadioptric reduction objective 41 according to FIG. 3 into a microlithographic projection apparatus, such as known as a wafer stepper. In the object plane of objective 41, a mask 42 is positioned by means of a xyz-positioning stage 421, illuminated with light of a suitable wavelength by a light source 44, for example, an excimer laser.

In the image plane of objective 41, a wafer 43 is positioned by means of a second xyz-positioning stage 431. It is understood that other variations of catadioptric reduction objectives according to FIGS. 1 and 2 and other realizations according to the invention can, in a similar manner, be incorporated in such a microlithographic projection apparatus.

Figure 5:
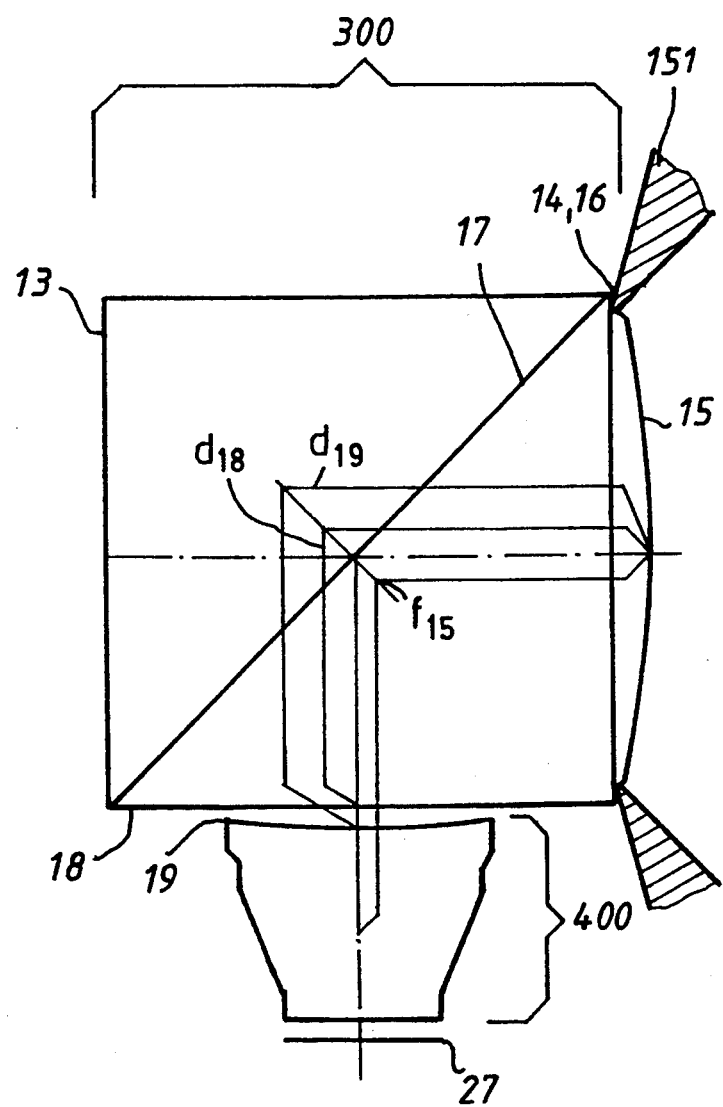

FIG. 5 shows part of the objective of FIG. 1 wherein light paths and details of the second lens group 400 are omitted for clarity. The following dimensions are shown in FIG. 5: the focal length $f_{15}$ of the concave mirror; the distance $d_{19}$ between the concave mirror 15 and the front surface 19 of the second lens group 400; and, the distance $d_{18}$ between the concave mirror and the exit surface 18 of the beam splitter 300. All these distances are subject to the deflection at the splitting mirror surface 18.

It is understood that the foregoing description is that of the preferred embodiments of the invention and that various changes and modifications may be made thereto without departing from the spirit and scope of the invention as defined in the appended claims.

TABLE 1

Wavelength $\lambda$ = 248 nm (0.1 nm FWHM)
Wavelength 248 nm   Quartz glass n = 1.50855 at 248 nm
FWHM = ± 100 pm   Numerical Aperture = NA = 0.52
Reduction Ratio $\beta$ = −1/4

| No. | Radius of curvature (mm) | Thickness (mm) | |
|---|---|---|---|
| 0 | Object Plane | 77.232 | |
| 1 | 575.010 | 25.000 | Glass |
| 2 | −493.082 | 212.823 | |
| 3 | −171.143 | 46.000 | Glass |
| 4 | −386.583 | 2.289 | |
| 5 | −961.355 | 16.000 | Glass |

TABLE 1-continued

Wavelength $\lambda$ = 248 nm (0.1 nm FWHM)
Wavelength 248 nm   Quartz glass n = 1.50855 at 248 nm
FWHM = ± 100 pm   Numerical Aperture = NA = 0.52
Reduction Ratio $\beta$ = −1/4

| No. | Radius of curvature (mm) | Thickness (mm) | |
|---|---|---|---|
| 6 | 154.896 | 59.176 | |
| 7 | −124.348 | 14.500 | Glass |
| 8 | −319.079 | 72.017 | |
| 9 | 743.787 | 43.000 | Glass |
| 10 | −191.051 | 22.341 | |
| 11 | −155.712 | 16.000 | Glass |
| 12 | −238.213 | 2.000 | |
| 13 | ∞ | 154.000 | Glass |
| 14 | ∞ | 12.000 | |
| 15 | −315.267 | −12.000 | Mirror |
| 16 | ∞ | −154.000 | Glass |
| 17 | Mirror Surface | | |
| 18 | ∞ | 7.527 | |
| 19 | −213.024 | 7.800 | Glass |
| 20 | −293.203 | .500 | |
| 21 | 117.503 | 11.100 | Glass |
| 22 | 1129.495 | .848 | |
| 23 | 76.710 | 23.272 | Glass |
| 24 | 56.455 | 3.958 | |
| 25 | 79.103 | 9.745 | Glass |
| 26 | −3233.755 | 5.000 | |
| 27 | Image Plane | | |

TABLE 2

Wavelength $\lambda$ = 248 nm (0.1 nm FWHM)
Wavelength 248.00 nm   Quartz glass n = 1.50850 at 248 nm
FWHM = ± 100 pm   Numerical aperture = NA = 0.58
Reduction Ratio $\beta$ = −1/4

| No. | Radius of curvature (mm) | Thickness (mm) | |
|---|---|---|---|
| 0 | Object Plane | 76.573 | |
| 1 | 655.390 | 25.000 | Glass |
| 2 | −521.224 | 208.105 | |
| 3 | 169.298 | 46.000 | Glass |
| 4 | −390.848 | 4.045 | |
| 5 | −1145.232 | 16.000 | Glass |
| 6 | 154.665 | 58.096 | |
| 7 | −121.813 | 14.500 | Glass |
| 8 | −336.481 | 71.245 | |
| 9 | 718.374 | 43.000 | Glass |
| 10 | −174.236 | 20.956 | |
| 11 | −147.053 | 16.000 | Glass |
| 12 | −244.332 | 2.000 | |
| 13 | ∞ | 157.000 | Glass |
| 14 | ∞ | 12.000 | |
| 15 | −314.137 | −12.000 | Mirror |
| 16 | ∞ | −157.450 | Glass |
| 17 | Mirror Surface | | |
| 18 | ∞ | 5.265 | |
| 19 | −264.219 | 7.800 | Glass |
| 20 | −432.367 | .500 | |
| 21 | 115.928 | 11.100 | Glass |
| 22 | 520.023 | .500 | |
| 23 | 89.500 | 9.456 | Glass |
| 24 | 152.687 | .788 | |
| 25 | 90.920 | 13.426 | Glass |
| 26 | 57.021 | 4.050 | |
| 27 | 87.592 | 9.819 | Glass |
| 28 | −3229.501 | 5.000 | |
| 29 | Image Plane | | |

TABLE 3

| | FIG. 2 | FIG. 1 | U.S. Pat. No. 4,953,960 |
|---|---|---|---|
| Reduction ratio $\beta$ | 1/4 | 1/4 | 1/4 |
| Image height | 15 mm | 15 mm | 15 mm |
| Image-side aperture NA | 0.58 | 0.52 | 0.45 |
| Image-side main beam angle | telectr. | telectr. | telectr. |
| Optical structural length | 1008 mm | 1010 mm | 1027 mm |
| Image-side intercept distance | 5.0 mm | 5.0 mm | 5.6 mm |

TABLE 3-continued

|  | FIG. 2 | FIG. 1 | U.S. Pat. No. 4,953,960 |
|---|---|---|---|
| Dimensions of the beam splitter: | Truncated pyramid | cube | truncated pyramid |
| Width entrance surface 13 | 166 mm | 154 mm | 131 mm |
| Width exit surface and entrance 14, 16 | 155 mm | 154 mm | 115 mm |
| Spacing 13 - 14 | 157 mm | 154 mm | 120 mm |
| Number of lenses |  |  |  |
| N (100, 200) | 6 | 6 | 4 |
| N (400) | 5 | 4 | 4 |
| N (between splitter and concave mirror) | — | — | 2 |
| Total Lenses | 11 | 10 | 10 |
| Focal length |  |  |  |
| f' (100, 200) | 486 mm | 475 mm | 495 mm |
| f' (400) | 127 mm | 129 mm | 131 mm |
| f' (intermediate splitter and concave mirror) | — | — | −3430 mm |
| f' (15) | 157 mm | 158 mm | 153 mm |
| Clear diameter of mirror 15 | 155 mm | 139 mm | 112 mm |
| Largest clear diameter | 172 mm | 159 mm | 171 mm |
| Distance (d) in air between mirror 15 and beam splitter exit surface 18 | 117 mm | 115 mm | 108 mm |
| Retrofocus ratio d/f' (400) | 0.92 | 0.89 | 0.82 |
| Reduction ratio of mirror 15 | 0.14 | 0.14 | 0.14 |

TABLE 4

| Reduction ratio β of objective | I | Reduction ratio of concave mirror (15) |
|---|---|---|
| 1:10 | I | 0.00 ± 0.10:1 |
| 1:5 | I | 0.10 ± 0.15:1 |
| 1:4 | I | 0.15 ± 0.15:1 |
| 1:2 | I | 0.35 ± 0.20:1 |

What is claimed is:

1. A catadioptric reduction objective for transmitting radiation from an object plane to an image plane defined by the objective, the catadioptric reduction objective defining an optical axis and comprising:

a first lens group for receiving the radiation and transmitting the radiation along said optical axis;

a concave mirror arranged on said axis;

a second lens group for focussing the radiation into said image plane;

a beam splitter mounted on said axis between said first lens group and said concave mirror for passing the radiation from said first lens group to said concave mirror and for deflecting the radiation returning from said concave mirror into said second lens group;

said beam splitter defining an exit/reentry surface through which the radiation passes to and returns from said concave mirror;

said exit/reentry surface and said concave mirror conjointly defining a clear uninterrupted lens-free space therebetween thereby facilitating centering of said concave mirror to said first and second lens groups;

said concave mirror and said second lens group conjointly defining a pupillary distance and said second lens group having a focal length;

said pupillary distance divided by said focal length defining a retrofocus ratio of less than one;

said concave mirror having a substantial reduction ratio; and, said catadioptric reduction objective having an image-side aperture of at least 0.50 and a working distance greater than 4 mm.

2. The catadioptric reduction objective of claim 1, further comprising an aperture diaphragm disposed at or near the location of said concave mirror and at a predetermined spacing from said second lens group; and, said predetermined spacing being less than said focal length for a standard condition where the refractive index of air is given on the full spacing and focal length.

3. The catadioptric reduction objective of claim 1, wherein said radiation is laser radiation and said laser radiation has a wavelength in the ultraviolet range or deep-ultraviolet range.

4. The catadioptric reduction objective of claim 1, wherein said beam splitter is configured as a beam splitter cube.

5. The catadioptric reduction objective of claim 1, further comprising a planar folding mirror arranged between said first lens group and said beam splitter.

6. The catadioptric reduction objective of claim 1, wherein said first and second lens groups and said beam splitter are all made of the same material.

7. The catadioptric reduction objective of claim 1, wherein said objective is telecentric in said image plane.

8. The catadioptric reduction objective of claim 1, wherein said objective has a reduction ratio of 1:2 to 1:10.

9. The catadioptric reduction objective of claim 1, wherein said concave mirror has a reduction ratio of between 0.55 and −0.10.

* * * * *